United States Patent
Leydier et al.

(10) Patent No.: US 6,695,214 B1
(45) Date of Patent: Feb. 24, 2004

(54) DEVICE WITH INTEGRATED CIRCUIT MADE SECURE BY ATTENUATION OF ELECTRIC SIGNATURES

(75) Inventors: Robert Leydier, Orsay (FR); Béatrice Bonvalot, Bures sur Yvette (FR); Eric Servel, Cugnaux (FR)

(73) Assignee: Schlumberger, Systémes, Montrouge (FR)

( * ) Notice: Subject to any disclaimer, the term of this patent is extended or adjusted under 35 U.S.C. 154(b) by 0 days.

(21) Appl. No.: 09/601,656

(22) PCT Filed: Feb. 4, 1999

(86) PCT No.: PCT/FR99/00246

§ 371 (c)(1),
(2), (4) Date: Dec. 7, 2000

(87) PCT Pub. No.: WO99/40538

PCT Pub. Date: Aug. 12, 1999

(30) Foreign Application Priority Data

Feb. 4, 1998 (FR) .............................................. 98 01305

(51) Int. Cl.[7] .............................................. G06K 19/06
(52) U.S. Cl. ....................... 235/492; 235/493; 235/451
(58) Field of Search .................. 235/492, 493, 235/451

(56) References Cited

U.S. PATENT DOCUMENTS

| | | | | |
|---|---|---|---|---|
| 4,810,864 A | * | 3/1989 | Takahashi | 235/380 |
| 4,864,292 A | | 9/1989 | Nieuwkoop | |
| 5,687,109 A | * | 11/1997 | Protigal et al. | 257/312 |
| 5,745,336 A | * | 4/1998 | Saito et al. | 361/321.1 |
| 5,847,447 A | * | 12/1998 | Rozin et al. | 235/678 |
| 5,986,890 A | * | 11/1999 | Hoppe et al. | 361/737 |
| 6,147,857 A | * | 11/2000 | Worley et al. | 361/301.2 |
| 6,276,609 B1 | * | 8/2001 | Czar et al. | 235/487 |

FOREIGN PATENT DOCUMENTS

JP   2-1-6-664 A   *   3/2001

* cited by examiner

Primary Examiner—Karl D. Frech
Assistant Examiner—Daniel Walsh
(74) Attorney, Agent, or Firm—Cohen, Pontani, Lieberman & Pavane

(57) ABSTRACT

An integrated circuit device (2) designed to be incorporated in a portable object with memory, in particular of card format. The integrated circuit device (2) comprises at least a capacitor (8) for attenuating-the amplitude of current peaks (Idd) consumed by the integrated circuit device (2). The attenuation of such current peaks is particularly useful for attenuating electric signatures in smart cards.

19 Claims, 5 Drawing Sheets

DEVICE WITH INTEGRATED CIRCUIT MADE SECURE BY ATTENUATION OF ELECTRIC SIGNATURES

This is a U.S. national stage of Application No. PCT/FR99/00246, filed on Feb. 4, 1999.

FIELD OF THE INVENTION

The invention concerns integrated circuit devices designed to be incorporated into portable memory objects and, in particular, into portable memory objects in the card format.

BACKGROUND OF THE INVENTION

Smart cards are generally used in applications in which the security of the storage and processing of confidential information is essential. These cards are designed particularly for applications in the health care field, pay television applications, or so-called electronic purse applications.

They are composed of a plastic card body into which an integrated circuit is incorporated. This can be an electronic module comprising an integrated circuit chip, or the integrated circuit chip itself.

The amplitude of the current Idd consumed by an integrated circuit is time dependent. The amplitude of the current Idd during which the integrated circuit performs a task for a certain period of time constitutes a current signature of the task. The analysis of this electric signature, and more precisely of its shape, reveals the activity of the device and makes it possible to access confidential information contained in said device.

In order to prevent such a signature analysis, certain methods of the prior art, in a first example, propose to use programming algorithms that in particular cause the triggering of operations at pseudo-random moments, or in a second example, propose to generate noise that is rich in random information or in erroneous operations.

These methods of the prior art have many disadvantages. They monopolize certain resources of the device, resources which could be used for performing other operations, and they are not resistant to detailed signature analysis.

OBJECTS AND SUMMARY OF THE INVENTION

One object of the invention is to protect access to confidential data by making the analysis of the electric signatures of integrated circuit devices more complex.

This and other objects are attained in accordance with one aspect of the invention directed to an integrated circuit device designed to be incorporated into a portable memory object, particularly in the card format, characterized in that it comprises at least one capacitor capable of attenuating the amplitude of the peaks of the current consumed by the integrated circuit of said device.

Advantageously, the capacitance has a value greater than about 0.1 nanofarad, particularly on the order of 1 nanofarad; the device also comprises at least one electrical resistor; the electrical resistance is characterized by a value greater than about 1 ohm, particularly on the order of 10 ohms; the resistor is a self-inductor; the self-inductance is characterized by a value greater than about 50 nanohenries, particularly 500 nanohenries; the capacitor is electrically connected both to a first pad or first region of the integrated circuit device and to a second pad or second region of the integrated circuit device, the first and second pads or the first and second regions being capable of being passed through by a supply current of the integrated circuit; the first pad is the contact pad Vss or the first region is the contact region Vss and the second pad is the contact pad Vdd or the second region is the contact region Vdd; the self-inductor is electrically connected to the second pad or to the second region of the integrated circuit device and connected in series with the capacitor; the capacitor is integrated into a supplementary layer of a chip; sub-layers forming electrodes of the capacitor are electrically connected to pads of the integrated circuit device; the self-inductor is in the form of a coil, integrated into an active side of a base layer of the integrated circuit device.

BRIEF DESCRIPTION OF THE DRAWINGS

The invention will be better understood through the reading of the following non-limiting description, written in reference to the attached drawings, in which.

DETAILED DESCRIPTION OF THE DRAWINGS

The present description of the invention deals with the example of chip cards. However, it is understood that the invention generally applies to any integrated circuit device designed to be incorporated into a portable memory object such as a subscriber identity module (SIM) in the token format or an electronic label.

Chip cards are standard portable objects that operate with and/or without contact and that are specifically defined in the ISO standards 78-10 and 78-16, whose contents are incorporated into the present description of the invention by reference.

Figure 1:
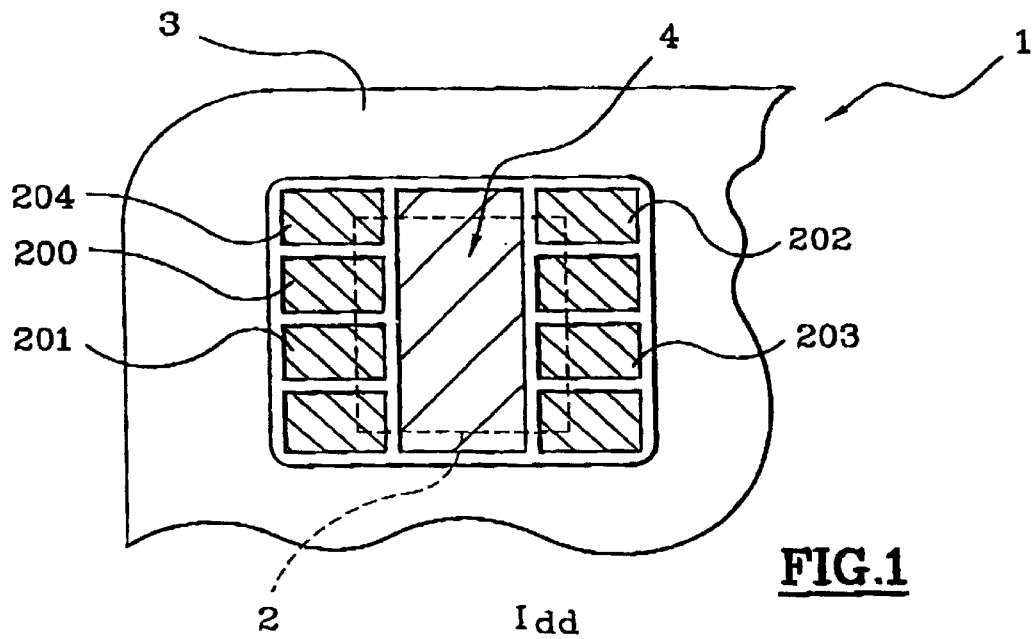
FIG. 1 shows, in a top view, part of a card equipped with an integrated circuit device according to the invention.
Figure 2:
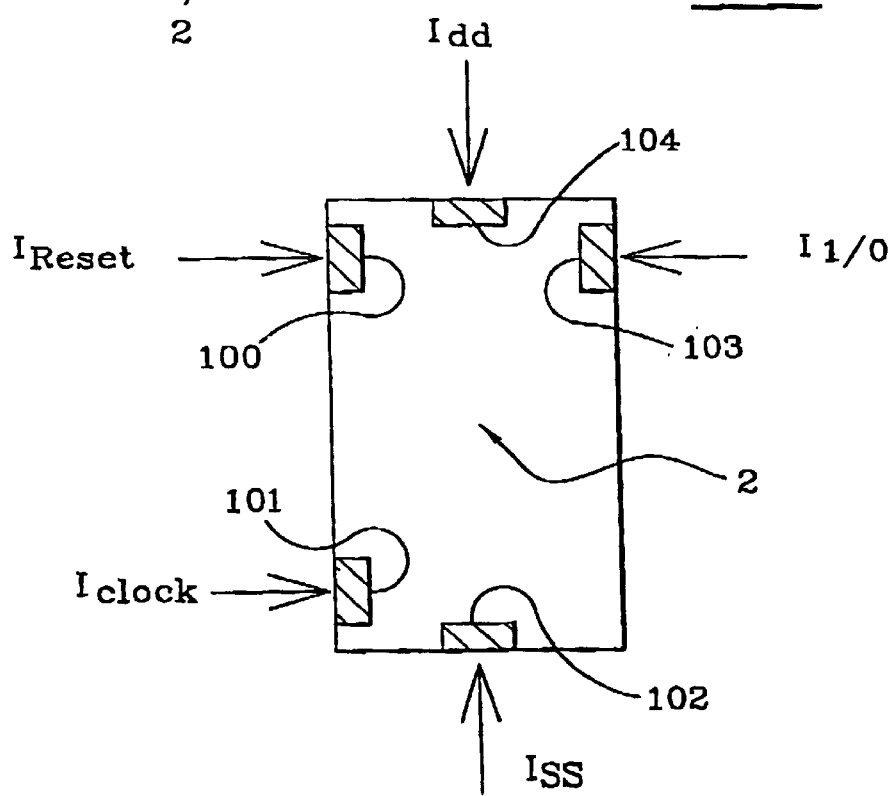
FIG. 2 shows, in schematic fashion, an integrated circuit device according to the invention.

As shown more particularly in FIGS. 1 and 2, the cards 1 having a contact-type operating mode comprise an integrated circuit chip 2 wherein at least five contact pads 100, 101, 102, 103 and 104 are electrically connected, by conductive leads not 30 represented, respectively to five contact regions 200, 201, 202, 203 and 204 located on the surface of the card body 3. A contact pad Reset 100 is connected to a contact region Reset 200, a contact pad Clock 101 is connected to a contact region Clock 201, a contact pad Iss 102 is connected to a contact region Vss 202, a contact pad I/O 103 is connected to a contact region I/O 203, and a contact pad Idd 104 is connected to a contact region Vdd 204.

A current respectively named $I_{Reset}$, $I_{Clock}$, $I_{SS}$, $I_{I/O}$ and $I_{dd}$ is passing through respectively the contact pads 100, 101, 102, 103 and 104, as well as the contact regions 200, 201, 202, 203 and 204.

The assembly of the chip 2, the conductive leads and the contact regions 200, 201, 202, 203 and 204 is generally comprised in an electronic module 4 incorporated into the card body 3.

The integrated circuit device according to the invention can be the electronic module 4 carrying the regions 200, 201, 202, 203 and 204 and comprising a chip, or the chip 2 itself.

Figure 3:
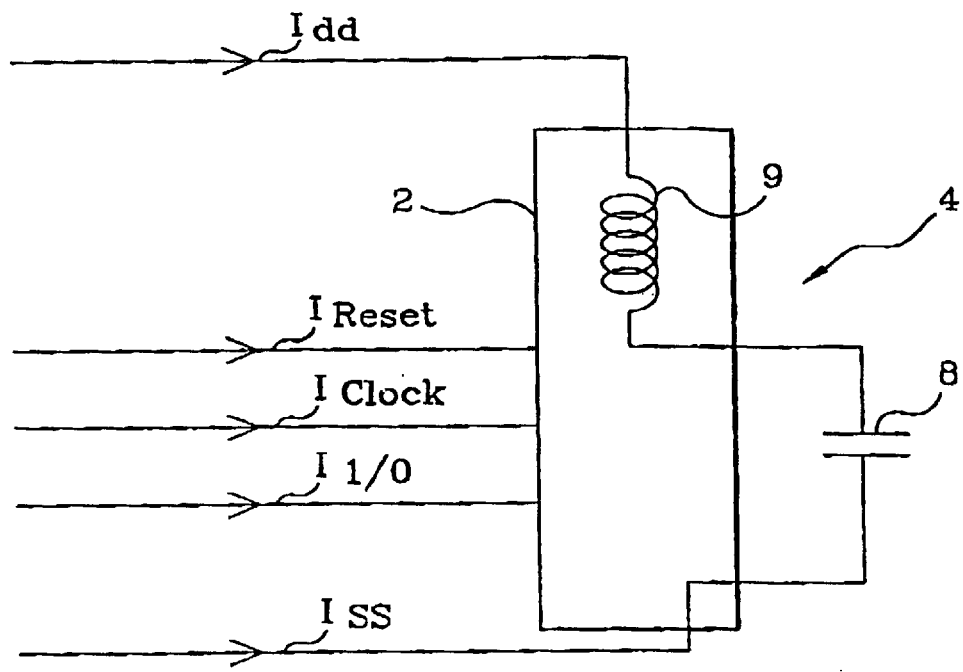
FIG. 3 is a schematic electrical representation of an integrated circuit device according to the invention.

As shown more particularly in FIG. 3, it is clear that, according to the invention, the integrated circuit device comprises a capacitor 8. Its capacitance 8 is characterized by a value greater than about 0.1 nanofarad, particularly on the order of 1 nanofarad. The incoming current Idd is filtered by a second order filter constituted by the resistance, if any, of connection circuit 120 in series with self-inductor 9 in series with capacitor 8 connected in parallel with the integrated circuit. Capacitor 8 supplies rapid current charges to the integrated circuit while the self-inductor 9 opposes any rapid changes in Idd. Thus, this arrangement is capable of attenuating the amplitude of the peaks of the current consumed by the integrated circuit of the device according to the invention.

Furthermore, the integrated circuit device according to the invention advantageously includes an electrical resistor. Its electrical resistance is characterized by a value greater than about 1 ohm, particularly on the order of 10 ohms. It is preferably constituted by a self-inductor 9. The self-inductance 9 is itself characterized by a value greater than about 50 nanohenries, particularly 500 nanohenries.

The capacitor 8 is electrically connected to the pad 102 of the chip 2 or to the region 202 of the electronic module comprising said chip 2, and to the pad 104 of the chip 2 or to the pad 204 of the electronic module 4. In the advantageous case where the device also comprises an electrical resistor, preferably constituted by the self-inductor 9, this self-inductor 9 is electrically connected to the pad 104 of the chip 2 or to the region 204 of the electronic module 4 comprising said chip 2 and connected in series with the capacitor 8.

Finally, the capacitor 8 and self-inductor 9 assembly constitutes a low-pass filtering cell, this filtering cell being constituted by at least a capacitor 8, preferably by a capacitor 8 and a resistor, the resistor preferably being a self-inductor 9, said filtering cell being located in the electronic module 4, advantageously in the immediate vicinity of the integrated circuit.

In the embodiment presented below in reference to FIGS. 4, 5 and 6, the chip 2 comprises the capacitor 8 and the self-inductor 9.

Figure 5:
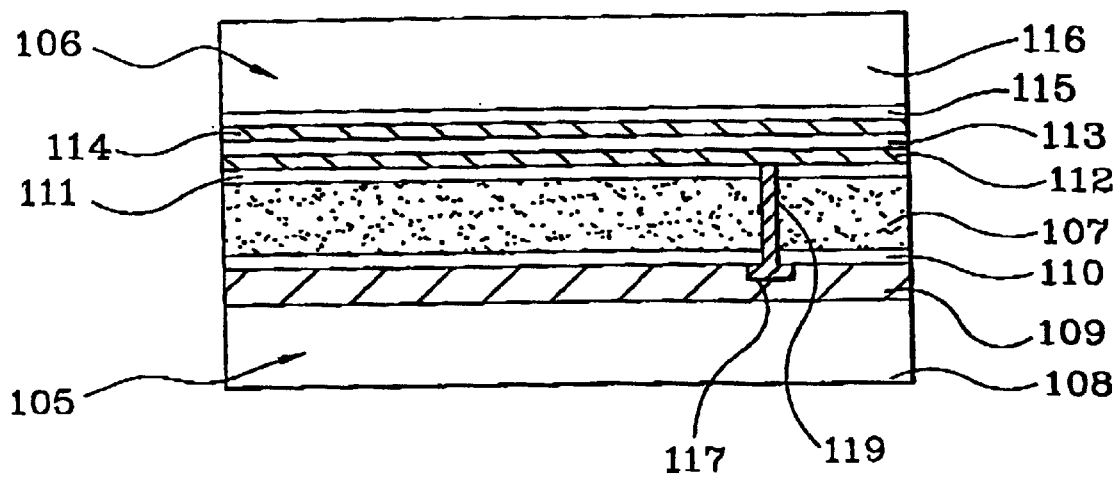
FIG. 5 illustrates, in cross section taken along line V—V in FIG. 4 an integrated circuit according to the invention.

Referring first of all to FIG. 5, it is clear that the chip 2 comprises three main layers. These include a first base layer 105, a supplementary layer 106, said first and second layers being linked by an intermediate embedding layer 107.

The layer 105 is composed of three sub-layers, a silicon sub-layer 108, a circuit integrating sub-layer 109, said sub-layers 108 and 109 being surmounted by a passivation layer 110.

The layer 106 is composed of six sub-layers, an insulating sub-layer 111, a conductive sub-layer 112, for example tantalum-based, forming a first electrode of the capacitor 8, an insulating and dielectric sub-layer 113, for example of tantalum oxide, a conductive sub-layer 114, for example tantalum-based, forming a second electrode of the capacitor 8, an insulating sub-layer 115 and a layer 116 of silicon or another material.

The embedding layer 107 is not subdivided into sub-layers. It is composed of an embedding agent, for example a polymer. It could be, in particular, a polyimide.

In one example, the thickness of the sub-layers 110, 111, 112, 113, 114 and 115 is on the order of several thousand angstroms, the thickness of the sub-layer 109 and the sub-layer 107 is on the order of 5 $\mu$m, the thickness of the sub-layer 108 is on the order of 50 $\mu$m, and the thickness of the layer 116 is on the order of 150 $\mu$m.

The capacitor 8 is thus integrated into the supplementary layer 106. The sub-layers 112 and 114 forming electrodes are electrically connected to interconnection pads 117, 118 of the integrated circuit by vias or conductive bumps 119.

Figure 6:
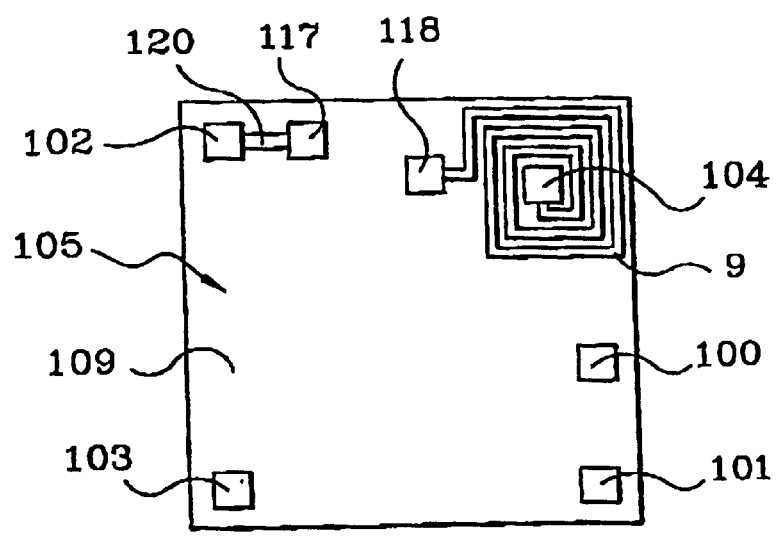
FIG. 6 is a top view of an active side of an integrated circuit device according to the invention.

As shown more particularly in FIG. 6, the self-inductor 9 is in the form of a coil integrated into the active side of the base layer 105. One of its two connection terminals is connected to the contact pad Idd 104, and the other to the interconnection pad 118.

The interconnection pad 117 is connected to the contact pad Vss 102 by a connection circuit 120, which is advantageously has the least resistance possible.

Figure 4:
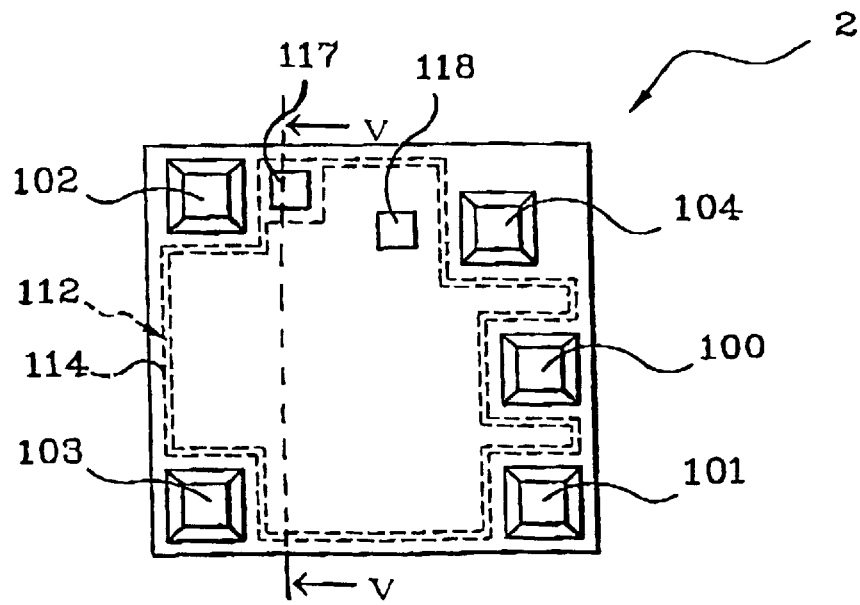
FIG. 4 illustrates, in a top view, an integrated circuit device according to the invention.

As seen more clearly in FIG. 4, the layers 106 and 107 are pierced with holes using micromachining techniques. These holes make it possible to establish connections by thermosonic wiring between the pads 100, 101, 102, 103 and.104 located on the active side of the base layer 105 and the contact pads 200, 201, 202, 203 and 204 of the electronic module 4.

In an integrated circuit device, the integrated circuit forms a complex structure of assembled logic cells, in which a central processing unit (CPU) distributes and manages, through a data bus and an address bus, information stored in RAM, ROM or EEPROM memories of said circuit. The integrated circuit may also form a microcontroller associated with the CPU, said microcontroller being more specifically intended for the cryptographic encoding of data requiring specialized calculation structures. This microcontroller is also called a cryptoprocessor.

Figure 7:
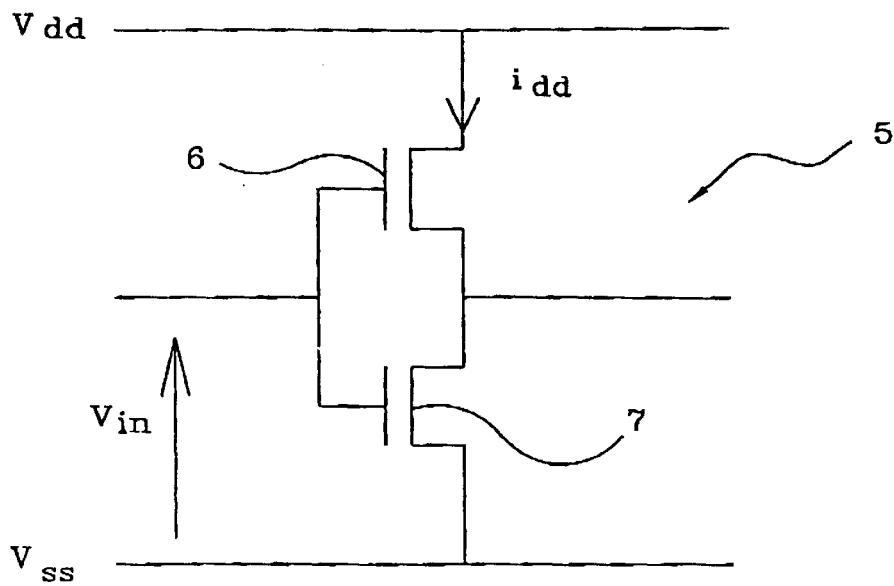
FIG. 7 represents an elementary CMOS logic cell of an integrated circuit device according to the invention.
Figure 8:
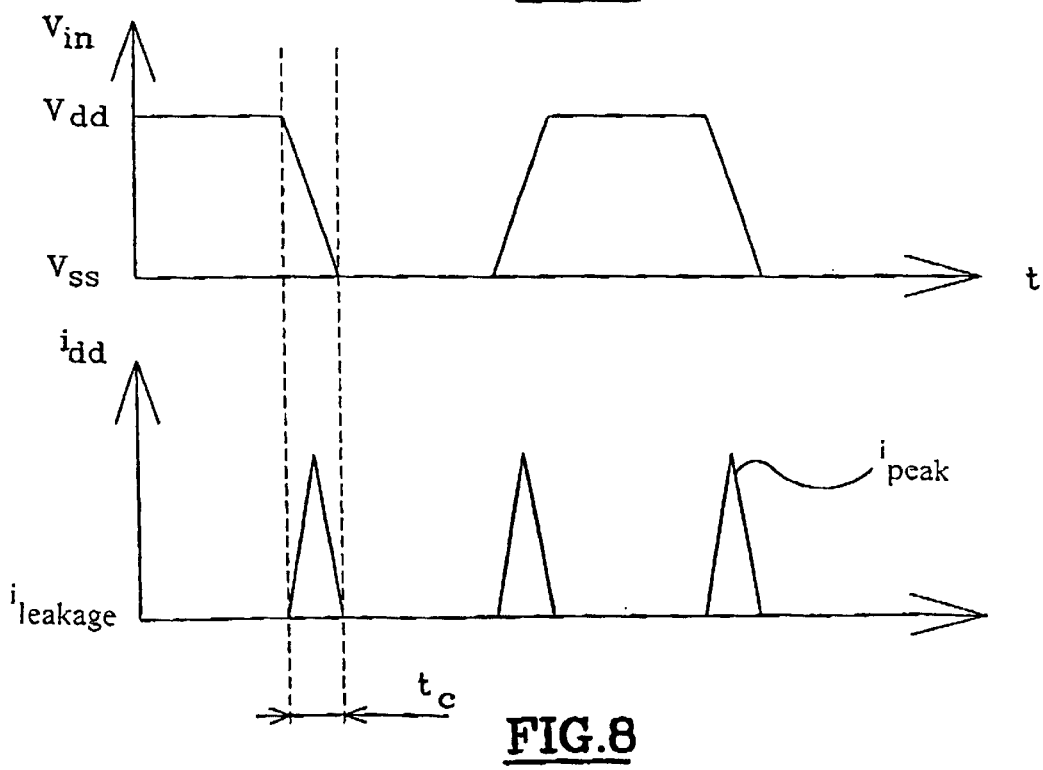
FIG. 8 shows characteristic signals Vin and $i_{dd}$ of the elementary CMOS logic cell of FIG. 7.

FIG. 7 represents an elementary logic cell 5 of an integrated circuit device according to the invention. This cell 5 is of the CMOS type. It is constituted by a first MOS transistor 6 of the P type and a second MOS transistor 7 of the N type, said transistors 6, 7 being connected in series. Each cell 5 is controlled by a logical control signal Vin common to both transistors 6, 7.

Let idd be the intensity of the current consumed by the cell 5.

In the two stable states, i.e., in the logical states 0 and 1, only one of the transistors, 6 or 7, is conductive, the other transistor 7 or 6 being non-conductive. The intensity of the current $i_{dd}$ consumed by the cell 5 is therefore equal to a leakage current value $i_{leakage}$, this value being substantially constant over time and depending, in particular, on the temperature. In practice $i_{leakage}$ is on the order of one nanoampere.

On the other hand, when a control voltage $V_{in}$ is applied to the input terminals of the cell 5, and when $V_{in}$ is greater than a threshold value that allows the transistors 6, 7 of said cell 5 to be switched from one stable state to another stable state, this cell 5, during a time interval $t_c$, is in an intermediate non-stable transient state between the logical states 0 and 1. The transistors 6 and 7 are then conductive and $i_{dd}$ is equal to $i_{switch}$, much greater than $i_{leakage}$, and culminates in an intensity value $i_{peak}$ whose value, in the invention, is several tens of microamperes.

By analyzing the variations in the intensity of the current Idd, it would be possible to deduce the changes in the states of the elementary logical cells 5 that participate in the flow of information between the various RAM, EEPROM, ROM and cryptoprocessor sub-assemblies of the integrated circuit, and to interpret the operation of the integrated circuit.

Figure 9:
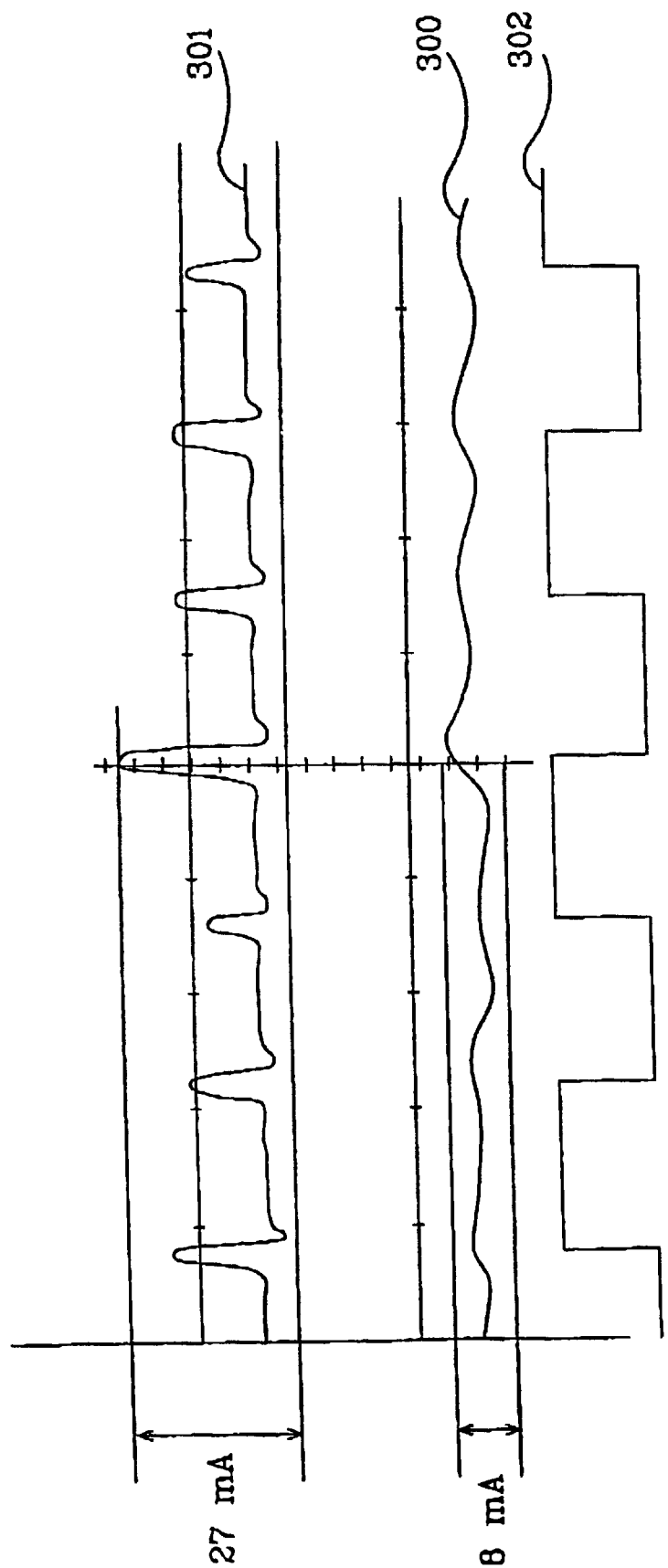
FIG. 9 shows the timing diagrams of three signals.

In FIG. 9, a curve 300 represents the intensity of the current Idd consumed in an integrated circuit device according to the invention as a function of time, a curve 301 represents the intensity of the current Idd consumed in a device according to the prior art as a function of time, the curves 300 and 301 being compared to a curve 302 representing the clock signal that controls this integrated circuit device.

The integrated circuit devices according to the invention and according to the prior art, which respectively produce the curves 300 and 301, consume power both on the rising edge and on the falling edge of the clock. It will be noted however, that this is not always the case. In fact, certain integrated circuit devices consume power on only one of the two clock edges fronts, and others have frequency multiplying means, in which case the number of current peaks per clock period is greater than two.

The curve 301 shows peaks in the intensity of the current Idd consumed whose height or amplitude is on the order of 27 mA. These peaks constitute a signature of the set of tasks performed by the integrated circuit. By carefully analyzing the curve 301 in association with a transaction, it is therefore possible to understand the operation of the integrated circuit and to extract confidential information. This is a non-destructive investigation method that breaches the security of the data and the transactions.

The curve 300, on the other hand, shows peaks in the intensity of the current Idd consumed whose height is on the order of 8 mA. Thus, thanks to the presence of the capacitor 8 and the self-inductor 9, the height of the peaks has been reduced by more than 50%. The careful analysis of the curve 300 in association with a transaction is thus especially complex. It is no longer possible to simply extract the confidential information using a non-destructive investigation method.

Furthermore, given the fact that sudden voltage drops due to large variations in the intensity of the supply current Idd can, during the operation of an integrated circuit device according to the prior art in the case where said drops bring the voltage down below a so-called nominal operational detection threshold, result in a reinitialization or a data loss and write errors causing a lack of integrity of the data, the attenuation of the electric signatures and the resulting absence of voltage drops in a device according to the invention provides an additional advantage.

It will be noted that the structure of CMOS integrated circuits is such that an integrated circuit device can be powered, in a degraded way, by its contact pads Reset 100, I/O 103 or Clock 101. These pads, unlike the supply pads Vss and Vdd are protected from electrostatic discharges, by non-linear devices. These devices are primarily constituted by two diodes connected to the supply bus of the integrated circuit. Thus, any supplying of power to the integrated circuits, in the degraded mode, by the pads Reset, I/O and Clock takes place through a diode to the power supply Vdd. This non-linear device, associated with the capacitor present in the Vdd, filters the supply current of the integrated circuit. However, it is understood that the embodiment described in the present specification with respect to the pads Vss and Vdd can be applied to the pads 100, 101 or 103 in order to attenuate the signatures of the electrical consumption of the integrated circuit in these pads.

It will also be noted that the integrated circuit chips according to the invention can be produced in batches, in the form of silicon slices known as wafers. For information on the batch production of chips, the reader is referred to the patent application filed in France under the number 97/10764, which has not yet been published, whose content is incorporated into the present application by reference.

It is understood that the present invention can increase the efficiency of programming routines by filtering, by means of an analog cell, the transient current phenomena that accompany all the tasks of an integrated circuit for a chip card.

What is claimed is:

1. Integrated circuit device adapted to be incorporated into a portable memory object, characterized in that the integrated circuit device comprises:

an integrated circuit including a cryptoprocessor that consumes current having a variable amplitude, at least one capacitor, and an impedance circuit, the at least one capacitor being coupled to said impedance circuit of the integrated circuit for attenuating peaks of said current consumed by said cryptoprocessor, at least a portion of said current consumed by said cryptoprocessor passing through the impedance circuit of the device.

2. Device according to claim 1, characterized in that the capacitor (8) has a value greater than about 0.1 nanofarad.

3. Device according to claim 2, characterized in that the impedance circuit comprises at least one electrical resistor.

4. Device according to claim 3, characterized in that the electrical resistor is characterized by an impedance value greater than about 1 ohm.

5. Device according to claim 4, characterized in that the resistor a self-inductor (9).

6. Device according to claim 5, characterized in that the self-inductor (9) is characterized by a value greater than about 60 nanohenries.

7. Device according to claim 6, characterized in that the capacitor (8) is electrically connected to a first pad or first region of the integrated circuit device, and to a second pad or second region of the integrated circuit device, the first and second pads or the first and second regions being capable of being passed through by a supply current of the integrated circuit.

8. Device according to claim 7, characterized in that the first pad is the contact pad Vss (102) or the first region is the contact region Vss (202) and in that the second pad is the contact pad Vdd (104) or the second region is the contact region Vdd (204).

9. Device according to claim 8, characterized in that the self-inductor (9) is electrically connected to the second pad or the second region of the integrated circuit device and connected in series with the capacitor (8).

10. Device according to claim 9, characterized in that the capacitor (8) is integrated into a supplementary layer (106) of a chip (2).

11. Integrated circuit device adapted to be incorporated into a portable memory object, the integrated circuit device comprising an integrated circuit that consumes current having a variable amplitude, and at least one capacitor coupled to the integrated circuit for attenuating peaks of said current consumed by the integrated circuit of the device, wherein the capacitor is electrically connected to a first pad or first region of the integrated circuit device, and to a second pad or second region of the integrated circuit device, the first and second pads or the first and second regions being capable of being passed through by a supply current of the integrated circuit, the first pad is contact pad Vss or the first region is contact region Vss and the second pad is contact pad Vdd or the second region is the contact region Vdd, the capacitor being integrated into a supplementary layer of a chip, characterized in that first and second sub-layers forming electrodes of the capacitor are electrically connected to pads of the integrated circuit device.

12. Device according to claim 10, characterized in that the self-inductor (9) is in the form of a coil integrated into an active side of a base layer (105) of the integrated circuit device.

13. Device according to claim 1, characterized in that the impedance circuit comprises at least one electrical resistor.

14. Device according to claim 3, characterized in that the resistor includes a parasitic series resistance of a self-inductor (9).

15. Device according to claim 1, characterized in that the capacitor (8) is electrically-connected to a first pad or first region of the integrated circuit device, and to a second pad or second region of the integrated circuit device, the first and second pads or the first and second regions being capable of being passed through by a supply current of the integrated circuit.

16. Device according to claim 7, characterized in that the self-inductor (9) is electrically connected to the second pad or the second region of the integrated circuit device and connected in series with the capacitor (8).

17. Device according to claim 1, characterized in that the capacitor (8) is integrated into a supplementary layer (106) of a chip (2).

18. Device according to claim 5, characterized in that the self-inductor (9) is in the form of a coil integrated into an active side of a base layer (105) of the integrated circuit device.

19. A portable memory object in card format, comprising:
  a single integrated circuit device forming a cryptoprocessor that consumes current having a variable amplitude; and
  at least one capacitor coupled to said integrated circuit device for attenuating peaks of said current consumed by the cryptoprocessor of said device.

* * * * *